United States Patent [19]
Floyd et al.

[11] Patent Number: 6,090,716
[45] Date of Patent: Jul. 18, 2000

[54] METHOD OF FABRICATING A FIELD EFFECT TRANSISTOR

[75] Inventors: Brian H. Floyd; Chin H. Ho, both of Sunnyvale; Mike F. Chang, Cupertino; Min Juang, Milpitas; Brian Cheung; Karen Lee, both of San Jose, all of Calif.

[73] Assignee: Siliconix Incorporated, Santa Clara, Calif.

[21] Appl. No.: 08/767,708

[22] Filed: Dec. 17, 1996

[51] Int. Cl.$^7$ .................................................. H01L 21/311
[52] U.S. Cl. ........................... 438/700; 438/672; 438/675
[58] Field of Search .................... 438/361, 366, 438/374, 700, 243, 245, 253, 254, 396, 397, 672, 675; 257/296, 306, 308, 309

[56] References Cited

U.S. PATENT DOCUMENTS

| | | | |
|---|---|---|---|
| 4,704,368 | 11/1987 | Goth et al. | 438/329 |
| 5,122,848 | 6/1992 | Lee et al. | 357/23.6 |
| 5,316,959 | 5/1994 | Kwan et al. | 437/40 |
| 5,358,884 | 10/1994 | Violette | 438/361 |
| 5,473,176 | 12/1995 | Kakumoto | 257/192 |
| 5,742,472 | 4/1998 | Lee et al. | 361/321.4 |
| 5,793,082 | 8/1998 | Bryant | 257/330 |
| 5,869,861 | 2/1999 | Chen | 257/308 |

FOREIGN PATENT DOCUMENTS

| | | |
|---|---|---|
| 2 264 388 | 8/1993 | United Kingdom . |
| WO 96/30947 | 10/1996 | WIPO . |

OTHER PUBLICATIONS

Syau, et al., "Extended Trench–Gate Power UMOSFET Structure with Ultralow Specific On–Resistance", *Electronics Letters*, Apr. 23, 1992, vol. 28, No. 9, pp. 865–867.

Syau, et al., "Comparison of Ultralow Specific On–Resistance UMOSFET Structures: The ACCUFET, EXTFET, INVFET, and Conventional UMOSFET's", IEEE Transactions on Electron Devices, vol. 41, No. 5, May 1994, pp. 800–808.

*Primary Examiner*—David Nelms
*Assistant Examiner*—Reneé R. Berry
*Attorney, Agent, or Firm*—Skjerven, Morrill, MacPherson, Franklin & Friel LLP; David E. Steuber

[57] ABSTRACT

In the present method, a semiconductor substrate is provided with an epitaxial layer thereon. A source/drain region is provided in a portion of the epitaxial layer, and a plurality of trenches are etched in the epitaxial layer and extend into the substrate, to define a plurality of mesas.

An oxide layer of generally uniform thickness is provided over the mesas and in the trenches, and a polysilicon layer is provided over the oxide layer and is etched so that the oxide layer overlying the mesas is exposed, and the top surface of the polysilicon within the trenches is below the level of the tops of the mesas.

A layer of spin-on-glass (SOG) is provided, and the SOG layer and oxide layer are etched substantially to the level of the tops of the mesas, to expose the tops of the mesas and to leave the portions of the SOG over the respective polysilicon portions in the trenches substantially coplaner with the tops of the mesas.

A conductive layer is provided over the remaining portions of the SOG layer and the tops of the mesas.

9 Claims, 6 Drawing Sheets

METHOD OF FABRICATING A FIELD EFFECT TRANSISTOR

FIELD OF THE INVENTION

This invention relates to semiconductor devices, and more particularly to a method of fabricating a trenched field effect transistor especially suited for low voltage switching applications.

BACKGROUND OF THE INVENTION

Field effect transistors (FETS) are well known, as are metal oxide semiconductor field effect transistors (MOSFETS). Such transistors are often used for power applications.

Examples of trench field effect transistors suitable for such applications are disclosed in "Comparison of Ultralow Specific On-Resistance UMOSFET Structures . . . " by Syau et al., IEEE Transactions on Electron Devices, Vol. 41, No. 5, May 1994. This document describes the so called INVFET structure 9 of present FIG. 1, which corresponds to FIG. 1(b) of the document. Present FIG. 1 shows only a portion of a single transistor including the polysilicon (polycrystalline silicon) gate electrode 10 which in this case is N type polysilicon which is insulated by a gate oxide layer 12 on its sides and bottom in a trench 14 and insulated on its top side by an oxide layer 18. The trench 14 extends through the N+ doped source region 22 through the P doped base region 24 and into the N+ doped drain region 26. The drain electrode 30 is formed on the underside of the drain region 26 and the source electrode 32 is formed on the top side of the source region 22.

Also described in FIG. 1(a) of that document and shown in present FIG. 2 is the ACCUFET structure 34 which is similar to the INVFET structure 9 except that the base region 24A is N– conductivity rather than P conductivity as in FIG. 1.

The ACCUFET 34 offers the best specific on resistance at the expense of poor blocking capability, while the INVFET 9 offers improved blocking at the expense of increased specific on resistance.

Reference is made to U.S. application Ser. No. 08/415,099, invented by Floyd et al., assigned to Siliconix incorporated, filed Mar. 31, 1995, now U.S. Pat. No. 5,592,005, for a description of the operation of such transistors.

It is the present intent to provide an efficient method for fabricating such transistors of the type described in that patent.

SUMMARY OF THE INVENTION

In the present invention, initially, a semiconductor substrate is provided, with an epitaxial layer thereon. A source/drain region is provided in a portion of the epitaxial layer, and a plurality of trenches are etched in the epitaxial layer and extend into the substrate, whereby a plurality of mesas are defined.

An oxide layer of generally uniform thicknesses is provided over the mesas and in the trenches, and a polysilicon layer is provided over the oxide layer so that portions thereof lie in respective trenches. The polysilicon layer is etched so that the oxide layer overlying the mesas is exposed, and the top surface of polysilicon within the trenches is below the level of the tops of the mesas.

Then, a spin-on-glass (SOG) layer is provided over the resulting structure, and the SOG layer and oxide layer are etched substantially to the level of the tops of the mesas, so as to provide that the tops of the mesas are exposed and leaving portions of the SOG layer over the respective polysilicon portions in the trenches and substantially coplaner with the tops of the mesas. Then, a conductive layer is provided over the remaining portions of the SOG layer and the tops of the mesas.

DESCRIPTION OF THE PREFERRED EMBODIMENTS

Figure 1:
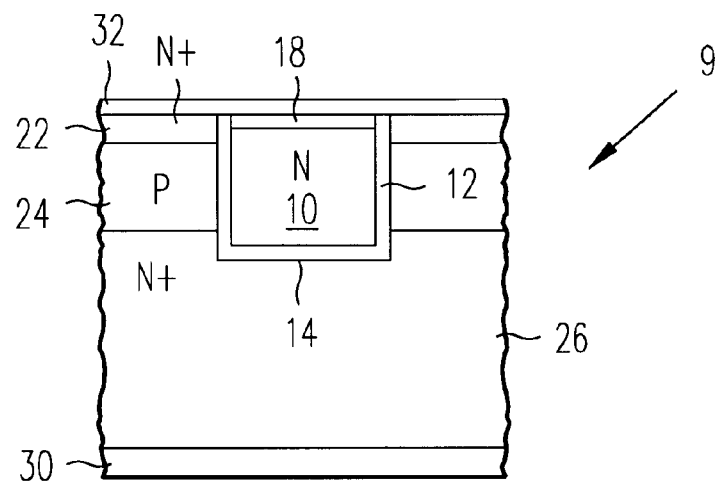
FIG. 1 is a cross-sectional view of a prior art INVFET.
Figure 3:
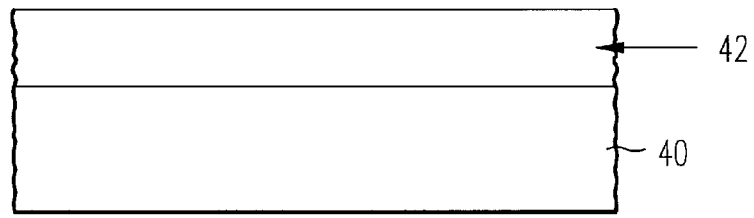
FIGS. 3–10 are cross-sectional views showing the invention process steps to fabricate the devices of FIGS. 1 or 2.
Figure 11:
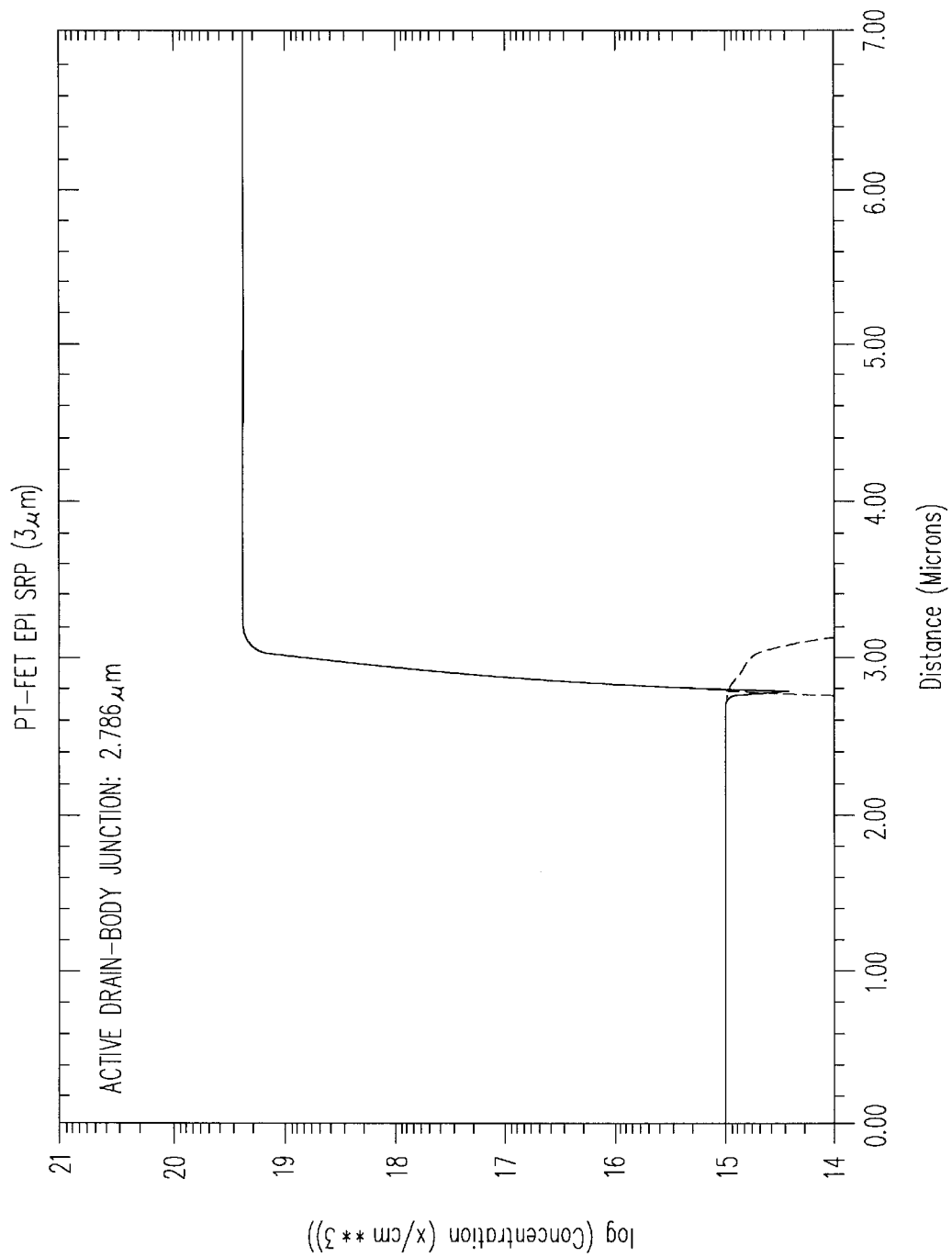
FIG. 11 is a graph showing concentration of doping in the initially provided epitaxial layer of a device fabricated in accordance with the present invention as at FIG. 3; and, FIG. 12 is a graph showing concentration of dopant in a completed device of, for example, FIG. 10.

Shown in FIG. 3 is a cross-sectional view of an early step of the inventive process in the fabrication of, for example, an INVFET of the type disclosed in FIG. 1. As shown in FIG. 3, an N+ semiconductor substrate 40 is provided, doped for example with arsenic, and a P– epitaxial layer 42 is grown thereover. The epitaxial layer may be on the order of $3\mu$ in thickness, and doped to the level of $10^{15}$ atoms/cm$^3$ with boron. FIG. 11 shows doping characteristics at the point with the PN junction approximately $2.8\mu$ deep.

Figure 4:
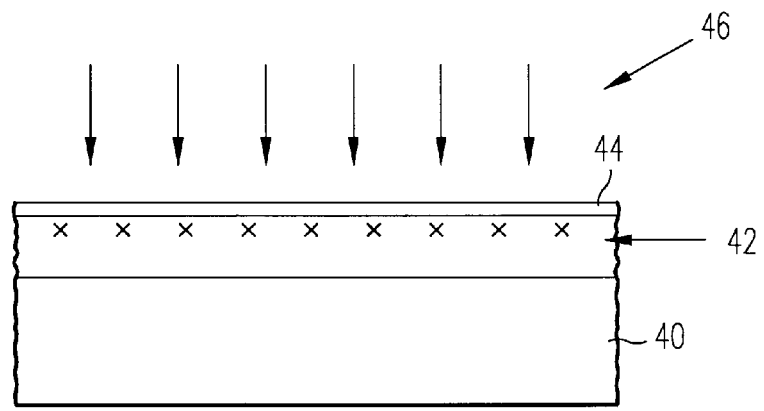

As shown in FIG. 4, a thin source implant oxide layer 44 is grown over the epitaxial layer 42 to a thickness of, for example, 300–400 Å, and arsenic 46 is implanted, at a dosage of 8E15 at 80 KeV. (As an alternative, a phosphorous implant may be undertaken.) An optional source drive step can then be undertaken.

Figure 5:
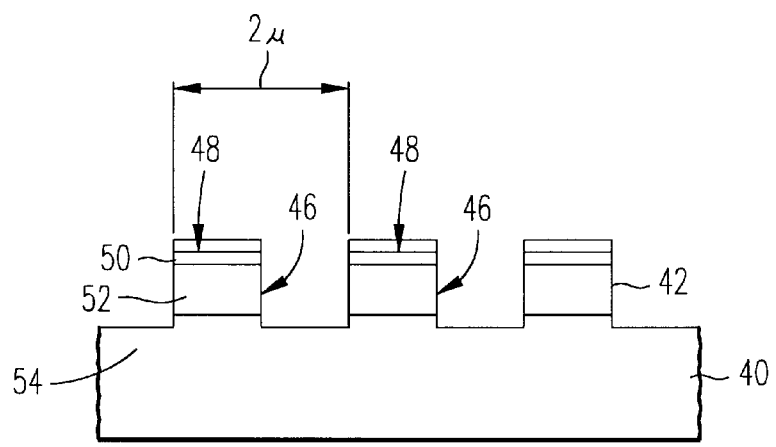
Figure 6:
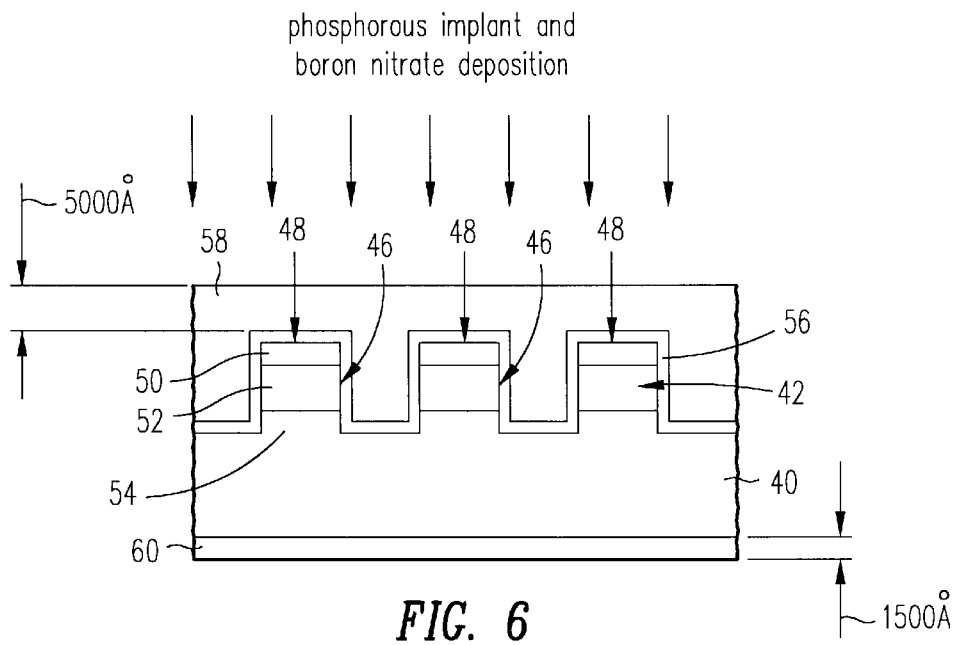

Next, patterned photoresist (not shown) is provided over the oxide layer 44, and an anisotropic trench etch is undertaken, to a depth of approximately $3\mu$, through the epitaxial layer 42 and into the substrate 40, forming trenches 46 which define mesas 48 at a pitch of approximately $2\mu$. This results in the structure shown in FIG. 5, wherein, for example, the region 50 is the source region, the region 52 is the base region, and the region 54 is the drain region.

After stripping of the resist, and growing and removal of a sacrificial oxide layer, a gate oxide layer 56 is grown over the resulting structure, to a thickness of approximately 500 Å, so that the oxide layer 56 overlies the mesas 48 and lies in the trenches 46. Then, a relatively thick polysilicon layer 58 is deposited to overlie the resulting structure, having portions thereof lying in and filling the respective trenches 46. At the same time, a polysilicon layer 60 is provided on the backside of the substrate.

The polysilicon layer 58 is etched back to a thickness of approximately 5000 Å as measured from the oxide 56 overlying the mesas 48. Next, the polysilicon layer 58 is implanted with phosphorous at a dosage of 1.0 E15 at 80 KeV, and a drivein step is undertaken to drive the phosphorous into the polysilicon layer 58. Next, a boron nitride deposition is undertaken with a soak to drive boron into the polysilicon layer 58. The 500 Å thickness of the oxide layer 56 provides that boron doping will properly reach the polysilicon in the bottom of each trench 46 without going across the oxide 56. A backside polysilicon etch sequence is undertaken to etch the backside polysilicon 60 to a thickness of approximately 1500 Å.

Figure 7:
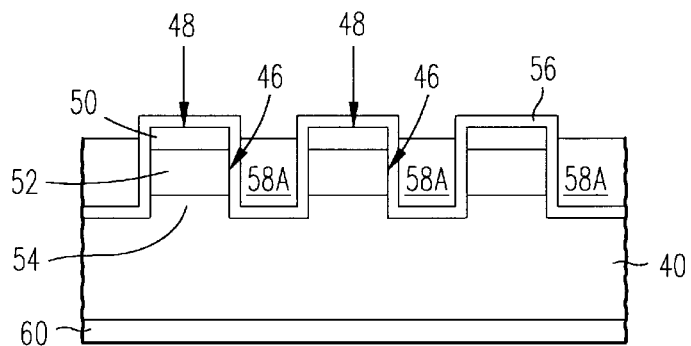

After removal of the boron nitride, the polysilicon layer 58 is masked and etched so that portions 58A of the polysilicon layer 58 remain in the respective trenches 46 with the top surfaces thereof between the level of the tops of the mesas 48 and the bottoms of the source regions 50, with polysilicon being completely removed from the oxide layer portions over the mesas 48, all as shown in FIG. 7.

Figure 8:
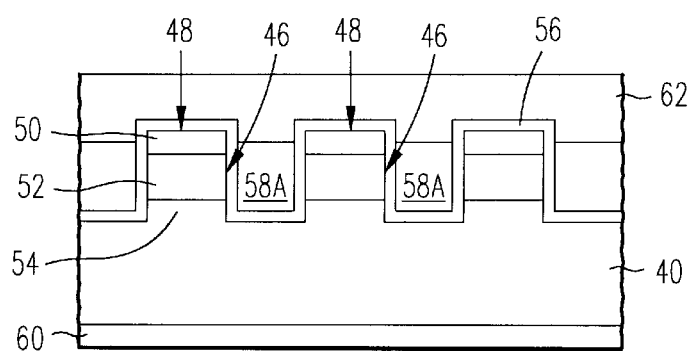

Next, spin-on-glass (SOG) or BPSG 62 is deposited over the resulting structure, and a thermal reflow is undertaken, resulting in the structure shown in FIG. 8.

Figure 9:
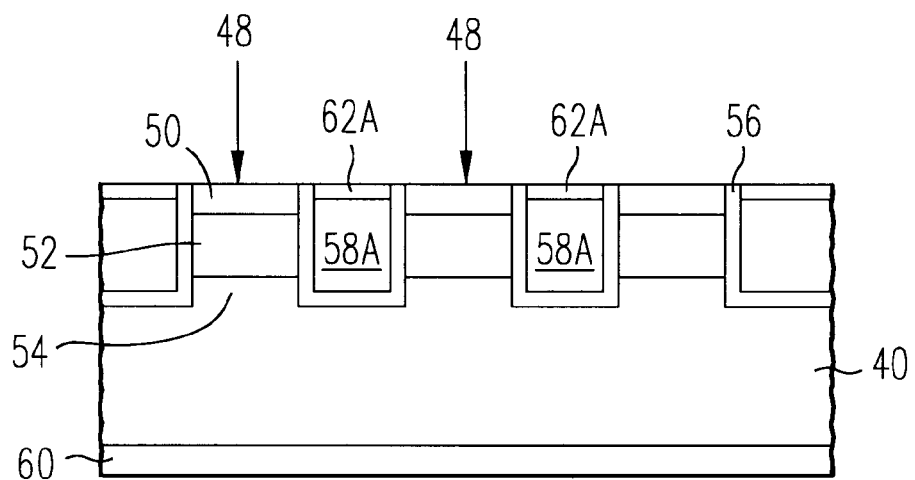

A contact mask/etch step is undertaken wherein the SOG layer 62 is etched back to expose the top portions of the oxide layer 56 over the mesas 48, and those oxide layer portions over the mesas 48 are etched back to expose the tops of the mesas 48, leaving portions 62A of the SOG layer 62 over the polysilicon 58A in each trench 46 and substantially coplaner with the tops of the mesas 48. Thus, the tops of the mesas 48 and the SOG layer portions 62A form a substantially planer top surface (FIG. 9).

Figure 2:
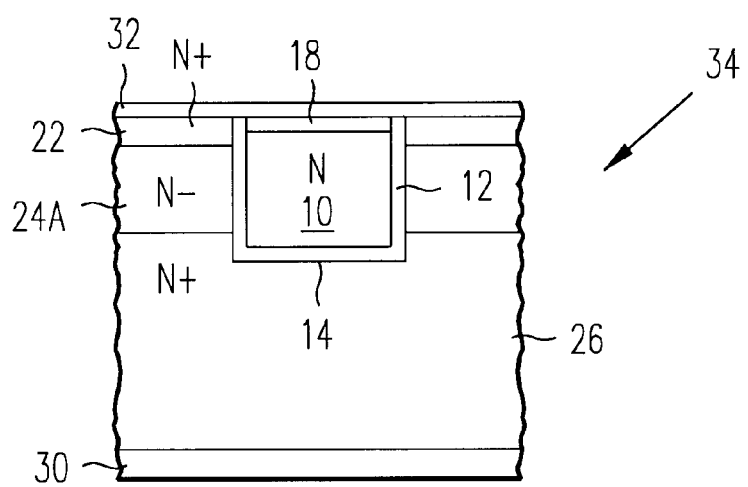
FIG. 2 is a cross-sectional view of a prior art ACCUFET.

Thereafter (FIG. 10), a metal layer 66, for example aluminum, is deposited over the resulting structure to contact the mesas 48 at the respective source regions 52 thereof, but not being in contact with the respective polysilicon regions 58A due to the fact that SOG 62A remains over the respective polysilicon regions 58A. The metal layer 66 will be seen as applied to a substantially planer surface defined by the SOG regions 62A and source regions 52, with significant advantages attendant thereto. In fabricating the ACCUFET of FIG. 2, the epitaxial layer would be provided as N−, for example, doped with phosphorous.

Figure 10:
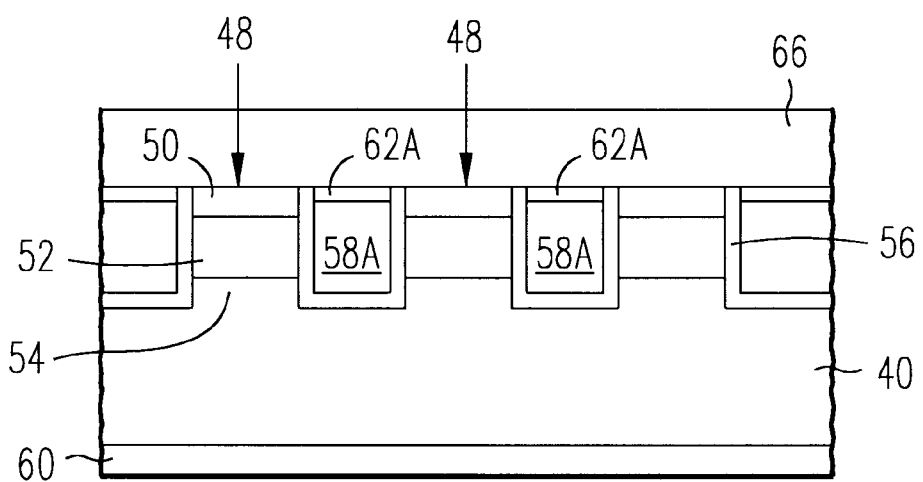
Figure 12:
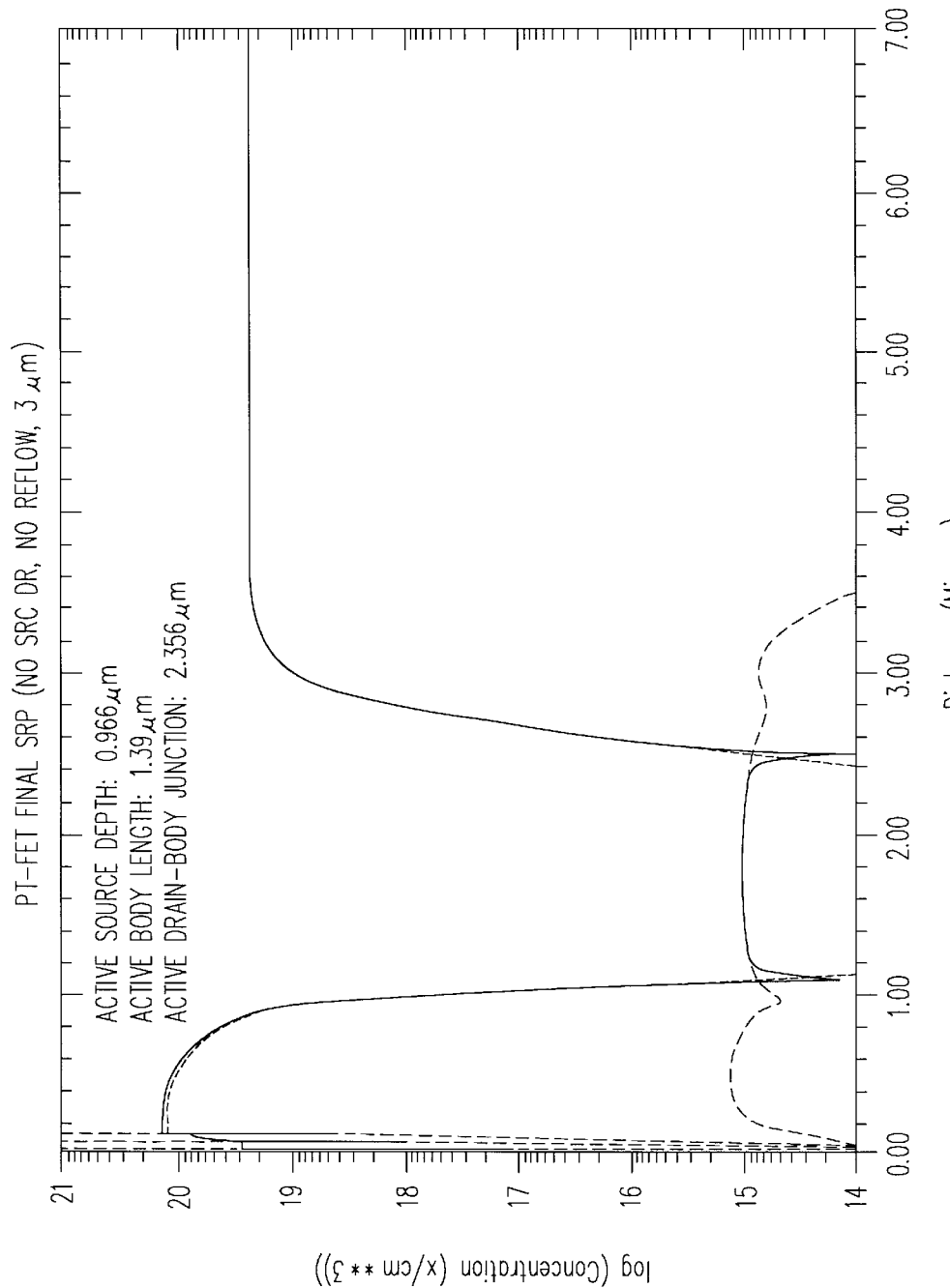

FIG. 12 shows the doping levels at various depths of the completed device as shown in FIG. 10, wherein the active source depth is approximately $0.97\mu$ deep, the active body length is approximately $1.4\mu$, and the active drain/body junction is approximately $2.4\mu$ deep.

What we claim is:

1. A method of fabricating a transistor structure comprising:

providing a semiconductor body including a mesa and a trench;

providing a first dielectric layer over the resulting structure so as to overlie the mesa and lie in the trench;

providing a polysilicon layer over the first dielectric layer so that a portion of the polysilicon layer completely fills a remaining volume of the trench;

etching the polysilicon layer so that the first dielectric layer overlying the mesa is exposed, and a top surface of polysilicon within the trench is below the level of the top of the mesa;

providing a second dielectric layer over the resulting structure; and etching the second dielectric layer and the first dielectric layer substantially to the level of the top of the mesa, so that the top of the mesa is exposed, a portion of the second dielectric layer remaining within the trench over the polysilicon within the trench, and a top surface of the portion of the second dielectric layer remaining in the trench being substantially coplanar with the top of the mesa.

2. The method of claim 1 and further comprising:

providing a conductive layer over the remaining portion of the second dielectric layer and dh top of the mesa.

3. The method of claim 1 and further comprising:

providing a source/drain region adjacent the top of the mesa.

4. The method of claim 3 and further comprising:

etching the polysilicon layer to the extent that the top surface of polysilicon within the trench is above the level of the bottom of the source/drain region.

5. The method of claim 1 and further comprising:

providing the semiconductor body of a semiconductor substrate and an epitaxial layer; and forming a trench in the epitaxial layer and extending into the substrate.

6. A method of fabricating a transistor structure comprising:

providing a substrate of a first conductivity type;

providing an epitaxial layer of a second conductivity type over the substrate;

forming a plurality of trenches in the epitaxial layer and extending into the substrate, whereby a plurality of mesas are defined by the epitaxial layer;

providing a first dielectric layer of generally uniform thickness over the mesas and in the trenches;

providing a polysilicon layer over the first dielectric layer so that portions of the polysilicon layer completely fill a remaining volume of the respective trenches;

etching the polysilicon layer so that the first dielectric layer overlying the mesas is exposed, and the top surface of polysilicon within the trenches is below the level of the tops of the mesas;

providing a second dielectric layer over the resulting structure; and etching the second dielectric layer and the first dielectric layer substantially to the level of the tops of the mesas, so that the tops of the mesas are exposed, portions of the second dielectric layer remaining in the trenches over the respective polysilicon portions in the trenches, and top surfaces of the second dielectric layer portions remaining in the trenches being substantially coplanar with the tops of the mesas.

7. The method of claim 6 and further comprising:

providing a conductive layer over the remaining portions of the second dielectric layer and the tops of the mesas.

8. The method of claim 7 and further comprising:

providing that the second dielectric layer is spin-on-glass (SOG).

9. The method of claim 6 and further comprising:

providing that the region of first conductivity type in the epitaxial layer defines source/drain regions adjacent the tops of respective mesas; and providing that etching the polysilicon layer results in the top surfaces of polysilicon within the trenches being above the bottom levels of respective source/drain regions.

* * * * *

UNITED STATES PATENT AND TRADEMARK OFFICE
CERTIFICATE OF CORRECTION

PATENT NO. : 6,090,716  Page 1 of 1
DATED : July 18, 2000
INVENTOR(S) : Floyd et al.

It is certified that error appears in the above-identified patent and that said Letters Patent is hereby corrected as shown below:

Column 4,
Line 3, please delete "dh" and insert -- the --.

Signed and Sealed this

Twenty-eighth Day of January, 2003

JAMES E. ROGAN
*Director of the United States Patent and Trademark Office*